(12) United States Patent
Jow et al.

(10) Patent No.: US 7,714,590 B2
(45) Date of Patent: May 11, 2010

(54) METHOD FOR TESTING COMPONENT BUILT IN CIRCUIT BOARD

(75) Inventors: Uei-Ming Jow, Chutung Hsinchu (TW); Min-Lin Lee, Chutung Hsinchu (TW); Shinn-Juh Lay, Chutung Hsinchu (TW); Chin-Sun Shyu, Chutung Hsinchu (TW); Chang-Sheng Chen, Chutung Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 318 days.

(21) Appl. No.: 11/708,935

(22) Filed: Feb. 20, 2007

(65) Prior Publication Data
US 2007/0152339 A1    Jul. 5, 2007

Related U.S. Application Data

(62) Division of application No. 11/131,741, filed on May 18, 2005, now Pat. No. 7,345,366.

(51) Int. Cl.
  *G01R 31/12* (2006.01)
  *G01R 31/02* (2006.01)
  *H01G 4/30* (2006.01)
  *H01G 4/228* (2006.01)

(52) U.S. Cl. .................. 324/537; 324/548; 324/754; 361/301.4; 361/306.1; 361/306.3; 361/308.1

(58) Field of Classification Search ............... 324/537, 324/548, 754, 755; 361/301.1, 301.4, 306.1, 361/306.3, 307–309
See application file for complete search history.

(56) References Cited

U.S. PATENT DOCUMENTS

| | | | |
|---|---|---|---|
| 5,110,664 A | 5/1992 | Nakanishi et al. | |
| 5,939,782 A | 8/1999 | Malladi | |
| 5,989,782 A | 11/1999 | Nishiki et al. | |
| 6,047,469 A * | 4/2000 | Luna | 324/754 |
| 6,255,602 B1 * | 7/2001 | Evans et al. | 174/262 |
| 6,400,576 B1 | 6/2002 | Davidson | |
| 6,577,490 B2 | 6/2003 | Ogawa et al. | |
| 6,771,077 B2 * | 8/2004 | Hamamura et al. | 324/537 |
| 6,876,216 B2 | 4/2005 | Fu-Chin | |
| 6,967,348 B2 | 11/2005 | Cowles et al. | |
| 7,131,047 B2 * | 10/2006 | Welbon et al. | 714/734 |
| 2003/0235929 A1 | 12/2003 | Cowles et al. | |

\* cited by examiner

*Primary Examiner*—Timothy J Dole
(74) *Attorney, Agent, or Firm*—Alston & Bird LLP

(57) ABSTRACT

A method is provided for testing a built-in component including multiple terminals in a multi-layered circuit board. At least one signal pad is provided on a top surface of the multi-layered circuit board for signal transmission. Each of the signal pads are electrically connected to one of the multiple terminals. At least one test pad is provided on the top surface of the multi-layered circuit board and each of the test pads is electrically connected to one of the multiple terminals. Then, detection occurs regarding one of the signal pads and one of the test pads that are electrically connected to a same one of the multiple terminals in order to determine a connection status of an electric path extending from the one signal pad through the same one terminal to the one test pad.

11 Claims, 14 Drawing Sheets

METHOD FOR TESTING COMPONENT BUILT IN CIRCUIT BOARD

CROSS-REFERENCE TO RELATED APPLICATIONS

This application is a divisional of U.S. application Ser. No. 11/131,741 filed May 18, 2005, now U.S. Pat. No. 7,345,366, which is incorporated herein by reference.

BACKGROUND OF THE INVENTION

The present invention relates generally to high-frequency test technology. More particularly, the present invention relates to an apparatus and method for testing components built in circuit boards.

FIG. 1A is a schematic diagram of a conventional multi-layered circuit board 1 provided with a built-in capacitor 10 in a perspective view. FIG. 1B is a cross-sectional view of multi-layered circuit board 1 shown in FIG. 1A taken along a line II-II.

Referring to FIGS. 1A and 1B, multi-layered circuit board 1 includes a first dielectric layer 100, a second dielectric layer 102, and capacitor 10 built in circuit board 1. First dielectric layer 100 is formed over second dielectric layer 102. Built-in capacitor 10 includes a first electrode plate 104 and a second electrode plate 106.—First electrode plate 104 in the example serves as a signal plate, and second electrode plate 106 serves as a ground plate. First electrode plate 104 is disposed between first and second dielectric layers 100 and 102, and second electrode plate 106 is disposed on a bottom surface (not numbered) of second dielectric layer 102. In other words, first electrode plate 104 and second electrode plate 106 are spaced apart by second dielectric layer 102. A signal pad 108 is formed at a top surface (not numbered) of circuit board 1, and more specifically, on the top of first dielectric layer 100 on which traces, active components, passive components or integrated circuits may be formed. Signal pad 108 is therefore a circuit node of a functional circuit (not shown) included in circuit board 1. Since capacitor 10 is built in circuit board 1, a via 110 is formed through first dielectric layer 100 to electrically connect signal pad 108 and first electrode plate 104. Via 110 is generally formed by forming an opening through first dielectric layer 100 by a mechanical drill or laser, and then filling in the opening with conductive material. First electrode plate 104 may include a lead 112 and a conductive pad 114 extending therefrom to electrically connect first electrode plate 104 and signal pad 108 through via 110.

During the formation of via 110, the opening may not be well formed such that an open-circuit issue may occur. For a multi-layered circuit board having built-in components, either passive or active, however, it may be difficult to test if there's an open-circuiting or short-circuiting in the circuit board. It is desirable to have an apparatus and method for testing a multi-layered circuit board provided with built-in components.

BRIEF SUMMARY OF THE INVENTION

The present invention is directed to a circuit and a method that obviate one or more problems resulting from the limitations and disadvantages of the prior art.

In accordance with an embodiment of the present invention, there is provided a multi-layered circuit board that includes a built-in component including multiple terminals, at least one signal pad formed on a top surface of the multi-layered circuit board for signal transmission, each of the at least one signal pad corresponding to one of the multiple terminals, and at least one test pad formed on the top surface of the multi-layered circuit board, each of the at least one test pad corresponding to one of the at least one signal pad for testing an electric path extending from the one signal pad through the one terminal to the each of the at least one test pad.

Also in accordance with the present invention, there is provided a multi-layered circuit board that includes a built-in capacitor including a first electrode and a second electrode, a signal pad formed on a top surface of the multi-layered circuit board for signal transmission in electrical connection with one of the first electrode or second electrode, and a test pad formed on the top surface of the multi-layered circuit board in electrical connection with the one of the first electrode or second electrode for testing an electric path extending from the signal pad through the one of the first electrode or second electrode to the test pad.

Further in accordance with the present invention, there is provided a multi-layered circuit board that includes a built-in inductor including a first end and a second end, a signal pad formed on a top surface of the multi-layered circuit board for signal transmission in electrical connection with one of the first end or second end, and a test pad formed on the top surface of the multi-layered circuit board in electrical connection with the one of the first end or second end for testing an electric path extending from the signal pad through the one of the first end or second end to the test pad.

Still in accordance with the present invention, there is provided a method for testing a built-in component including multiple terminals in a multi-layered circuit board that includes providing at least one signal pad on a top surface of the multi-layered circuit board for signal transmission, electrically connecting each of the at least one signal pad to one of the multiple terminals, providing at least one test pad on the top surface of the multi-layered circuit board, electrically connecting each of the at least one test pad to one of the multiple terminals, and detecting one of the at least one signal pad and one of the at least one test pad that are electrically connected to a same one of the multiple terminals to determine a connection status of an electric path extending from the one signal pad through the same one terminal to the one test pad.

Yet still in accordance with the present invention, there is provided a method for testing a built-in capacitor including a first electrode and a second electrode in a multi-layered circuit board that includes providing a signal pad for signal transmission on a top surface of the multi-layered circuit board, electrically connecting the signal pad to one of the first electrode or second electrode of the built-in capacitor, providing a test pad on the top surface of the multi-layered circuit board, electrically connecting the test pad to the one of the first electrode or second electrode of the built-in capacitor, and detecting the signal pad and the test pad to determine whether there is an open-circuiting in an electric path extending from the signal pad through the one of the first electrode or second electrode to the test pad.

Further still with the present invention, there is provided a method for testing a built-in inductor including a first end and a second end in a multi-layered circuit board that includes providing a signal pad for signal transmission on a top surface of the multi-layered circuit board, electrically connecting the signal pad to one of the first end or second end of the built-in capacitor, providing a test pad on the top surface of the multi-layered circuit board, electrically connecting the test pad to the one of the first end or second end of the built-in capacitor, and detecting the signal pad and the test pad to determine whether there is an open-circuiting in an electric path extending from the signal pad through the one of the first end or second end to the test pad.

Additional features and advantages of the present invention will be set forth in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the present invention and together with the description, serves to explain the principles of the invention.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 2A:
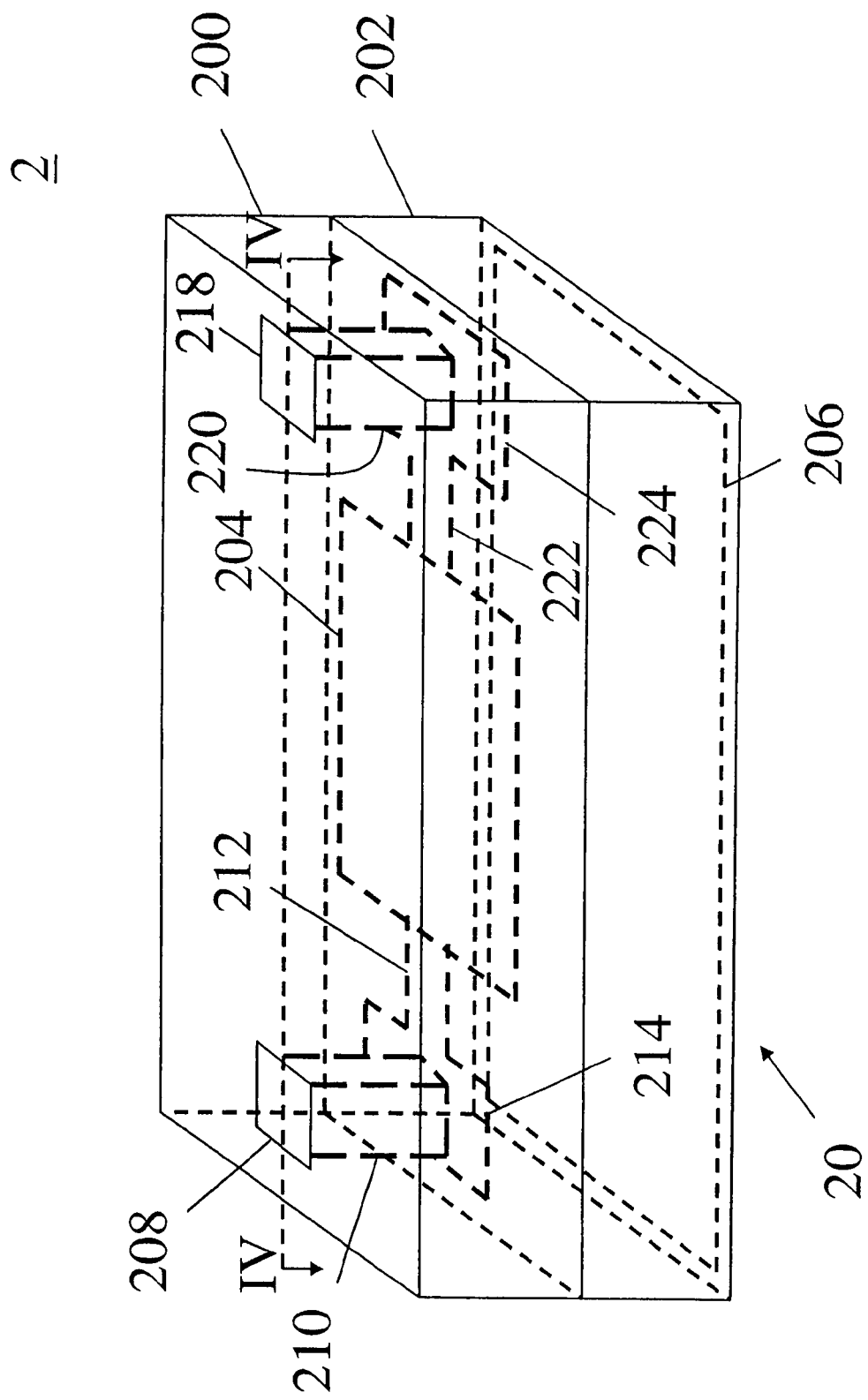
FIG. 2A is a schematic diagram of a multi-layered circuit board provided with a built-in component in accordance with one embodiment of the present invention in a perspective view.
Figure 2B:
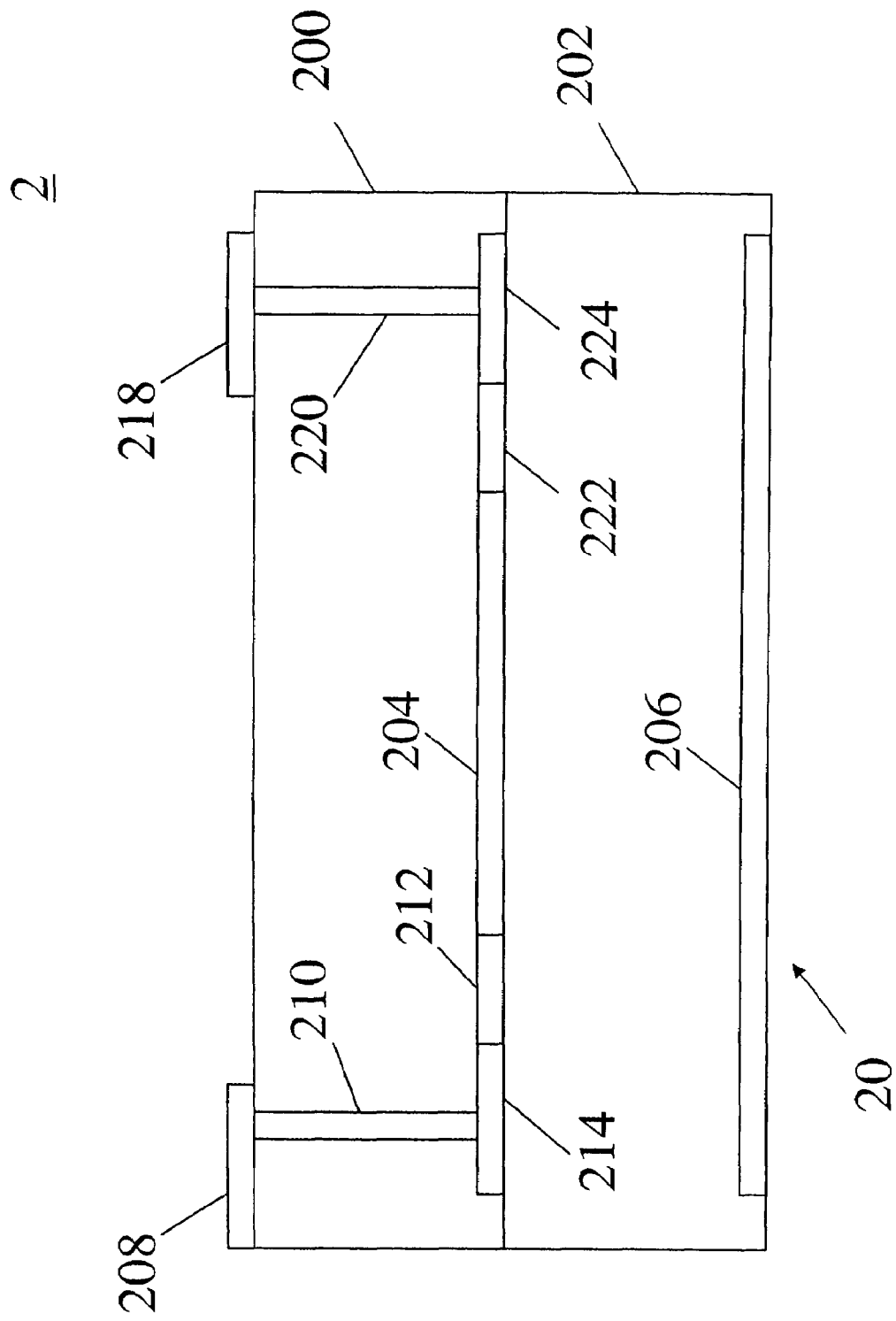
FIG. 2B is a cross-sectional diagram of the multi-layered circuit board shown in FIG. 2A taken along a line IV-IV.

FIG. 2A is a schematic diagram of a multi-layered circuit board provided 2 with a built-in component 20 in accordance with one embodiment of the present invention in a perspective view. In the present example, built-in component 20 includes a capacitor. FIG. 2B is a cross-sectional diagram of multi-layered circuit board 2 shown in FIG. 2A taken along a line IV-IV.

Referring to FIGS. 2A and 2B, multi-layered circuit board 2 includes a first dielectric layer 200, a second dielectric layer 202, and capacitor 20 built in circuit board 2. First dielectric layer 200 is formed over second dielectric layer 202. Built-in capacitor 20 includes a first electrode plate 204 and a second electrode plate 206. In this example, first electrode plate 204 serves as a signal plate for signal transmission, and second electrode plate 206 serves as a ground plate connected to a reference voltage level (not shown). First electrode plate 204 is disposed approximately between first and second dielectric layers 200 and 202, and second electrode plate 206 is disposed at a bottom surface (not numbered) of second dielectric layer 202. First electrode plate 204 and second electrode plate 206 are therefore spaced apart by second dielectric layer 202.

Circuit board 2 includes a signal pad 208 formed thereon. Specifically, signal pad 208 is disposed on a top surface (not numbered) of first dielectric layer 200 where traces, active components, passive components or integrated circuits may be provided. Signal pad 208 is a circuit node of a functional circuit included in circuit board 2. Since capacitor 20 is built in circuit board 2, a via 210 is formed through first dielectric layer 200 to electrically connect signal pad 208 and first electrode plate 204. Via 210 may be formed by forming an opening through first dielectric layer 200 by a mechanical drill or laser, and then filling in the opening with conductive material. First electrode plate 204 includes a first lead 212 and a first conductive pad 214 for electrical connection with via 210.

Circuit board 2 further includes a test pad 218 formed thereon. Specifically, test pad 218 is disposed on the top surface of first dielectric layer 200. A test pad according to the present invention is used to test whether there is an open-circuiting in an electrical path from a pad of interest to the test pad, or whether there's a short-circuiting between a pad of interest to the test pad, where an electrical connection should not have been provided. In the present embodiment, test pad 218, corresponding to signal pad 208, facilitates an open-circuiting test on an electrical path extending from signal pad 208, through first electrode plate 204 of built-in capacitor 20, to test pad 218. A via 220 is formed through first dielectric layer 200 to electrically connect test pad 218 and first electrode plate 204. First electrode plate 204 includes a second lead 222 and a second conductive pad 224 for electrical connection with via 220.

During normal operation, test pad 218 is kept at a floating state. During a testing operation, a first probe (not shown) and a second probe (not shown) are applied to signal pad 208 and test pad 218, respectively for conducting an open-circuiting or short-circuiting test.

Figure 3:
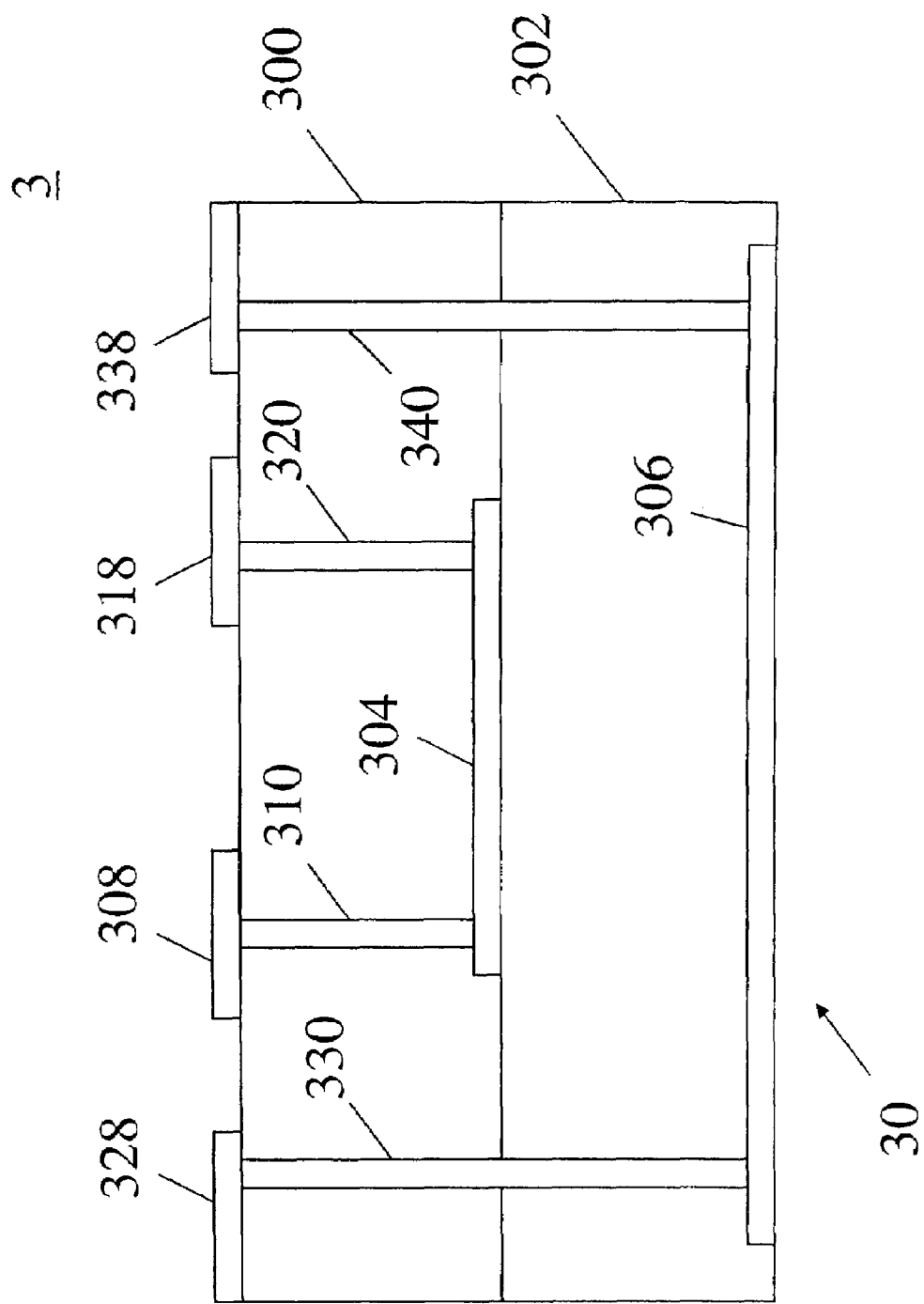
FIG. 3 is a schematic cross-sectional diagram of a multi-layered circuit board provided with a built-in component in accordance with another embodiment of the present invention in a cross-sectional view.

FIG. 3 is a schematic diagram of a multi-layered circuit board 3 provided with a built-in component 30 in accordance with another embodiment of the present invention in a cross-sectional view. In the present example, built-in component 30 includes a capacitor. Referring to FIG. 3, multi-layered circuit board 3 of the present invention includes a first dielectric layer 300, a second dielectric layer 302, and capacitor 30 built in circuit board 3. Built-in capacitor 30 includes a first electrode plate 304 and a second electrode plate 306. At least one of first electrode plate 304 or second electrode plate 306 serves a signal plate in multi-layered circuit board 3. First electrode plate 304 is disposed between a first dielectric layer 300 and a second dielectric layer 302. Second electrode plate 306 is disposed at a bottom surface (not numbered) of second dielectric layer 302. A first signal pad 308 and a second signal pad 328 are spaced apart from each other at a top surface of circuit board 3. First signal pad 308 is electrically connected to first electrode plate 304 through a first via 310. Likewise, second signal pad 328 is electrically connected to second electrode plate 306 through a second via 330.

A first test pad 318 corresponding to first signal pad 308 and a second test pad 338 corresponding to second signal pad 328 are disposed at the top surface of circuit board 3. First test pad 318 is electrically connected to first electrode plate 304 through a via 320, while second test pad 338 is electrically connected to second electrode plate 306 through a via 340.

During normal operation, first test pad 318 and second test pad 338 are kept at a floating state. During a testing operation, a first electrical path from first signal pad 308, through first electrode plate 304, to first test pad 318 is tested by means of, for example, a pair of probes, to determine whether there is an open-circuiting in the first electrical path. Likewise, a second electrical path from second signal pad 328, through second electrode plate 306, to second test pad 338 is tested to determine whether there is an open-circuiting in the second electrical path. Furthermore, during a testing operation, first signal pad 308 and second test pad 338, which are not electrically connected, are tested to determine whether there is a short-circuiting therebetween. Likewise, second signal pad 328 and first test pad 318, which are not electrically connected, are tested to determine whether there is a short-circuiting therebetween.

Figure 4A:
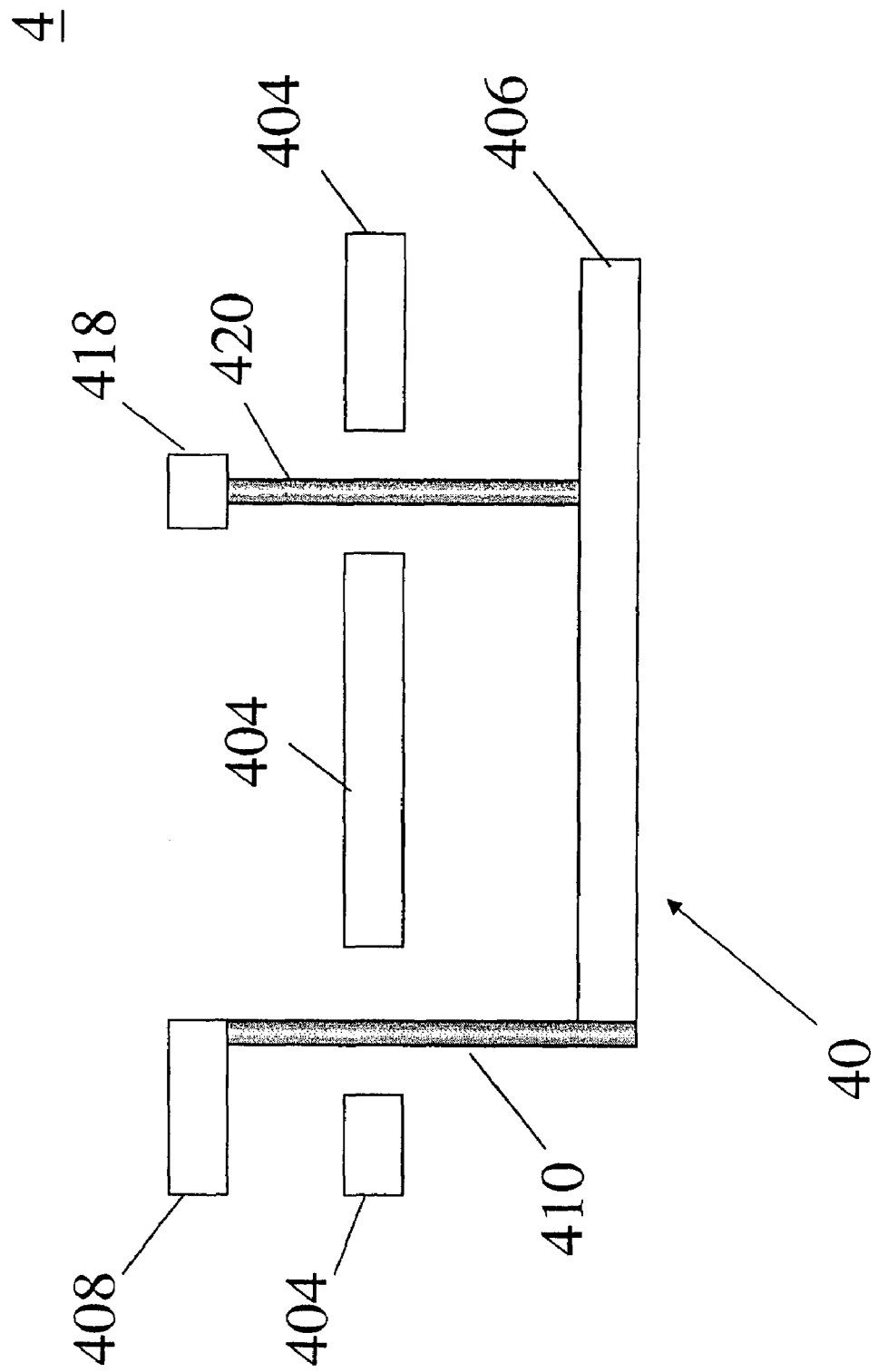
FIGS. 4A to 4C are schematic, cross-sectional diagrams of multi-layered circuit boards provided with built-in components in accordance with still another embodiments of the present invention.
Figure 4B:
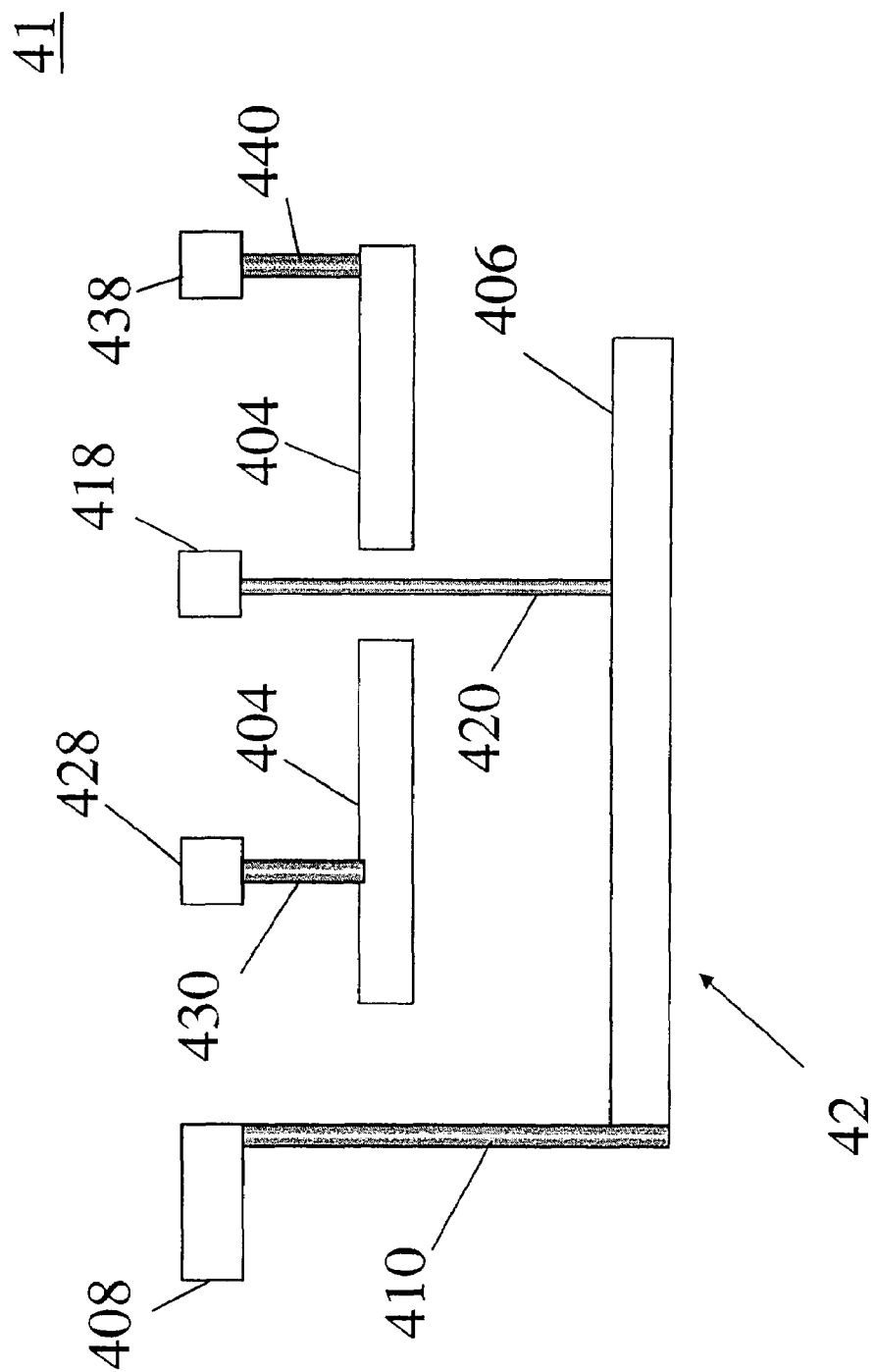
Figure 4C:
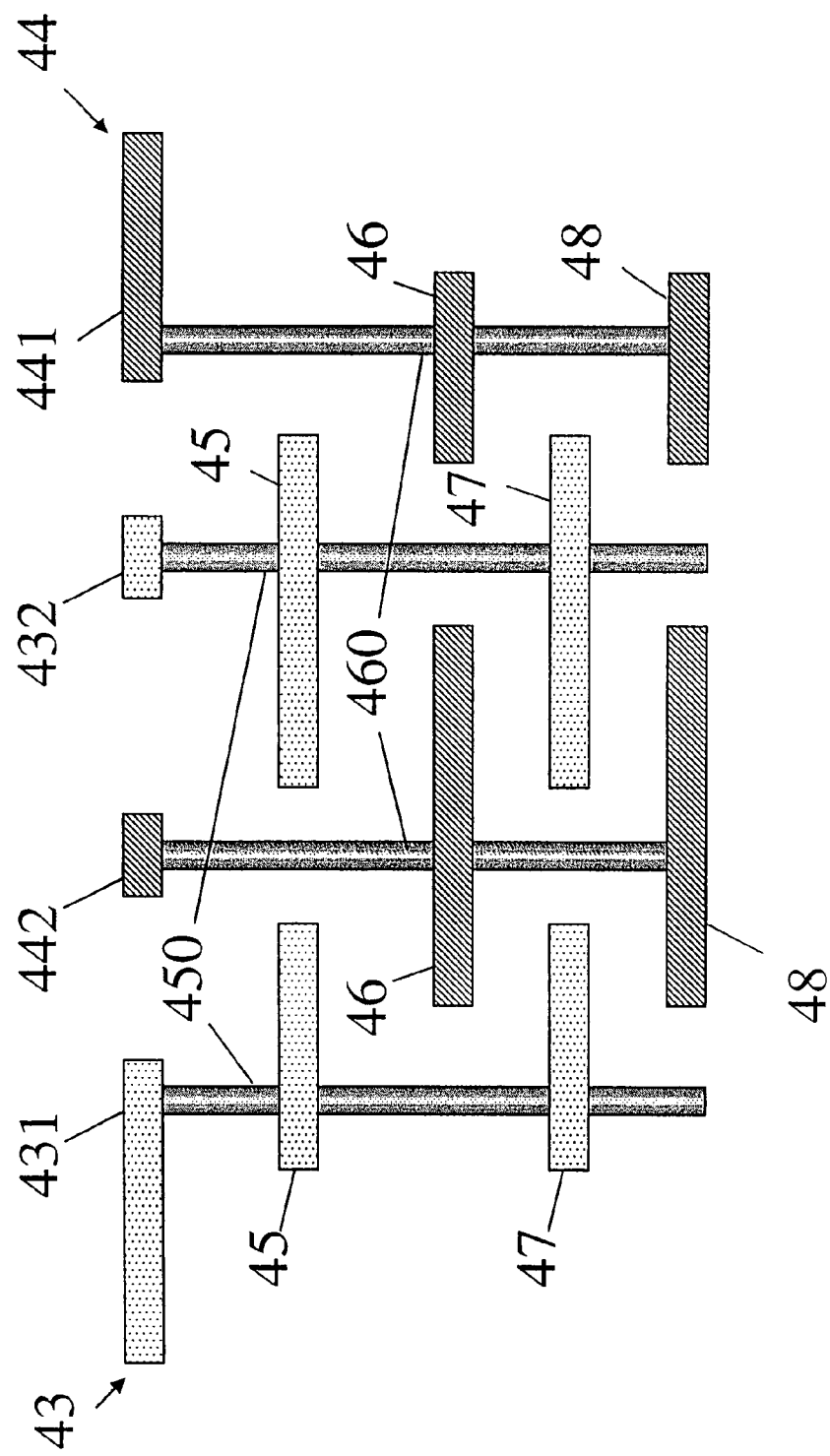

FIGS. 4A to 4C are schematic, cross-sectional diagrams of multi-layered circuit boards provided with built-in components in accordance with still another embodiments of the present invention. In the present examples, the built-in components include capacitors. Referring to FIG. 4A, a multi-layered circuit board 4 includes a built-in capacitor 40, a signal pad 408 and a test pad 418. Built-in capacitor 40 includes a first electrode plate 404 and a second electrode plate 406. Signal pad 408 is electrically connected to second electrode plate 406 through a via 410. Test pad 418 is electrically connected to second electrode plate 406 through a via 420. In the present example, built-in capacitor 40 is a single-port capacitor, in which one of electrodes, i.e., second electrode 406, serves as a signal plate for signal transmission, while first electrode 404 serves as a ground plate.

Referring to FIG. 4B, a multi-layered circuit board 41 including a built-in capacitor 42 has a similar structure as multi-layered circuit board 4 shown in FIG. 4A, except that an additional signal pad 428 and an additional test pad 438 corresponding to the additional signal pad 428 are provided. Vias 430 and 440 electrically connect signal pad 428 and test pad 438, respectively, to first electrode plate 404. Built-in capacitor 42 is a dual-port capacitor, in which both of electrodes, i.e., first electrode 404 and second electrode 406, function to serve as signal plates for signal transmission.

Referring to FIG. 4C, a multi-layered circuit board 45 includes a first electrode and a second electrode. The first electrode includes a first layer 43, a second layer 45 and a third layer 47 electrically connected to each other by vias 450. The second electrode includes a first layer 44, a second layer 46 and a third layer 48 electrically connected to each other by vias 460. A first signal pad 431 and a first test pad 432 corresponding to first signal pad 431 are disposed on first layer 43 of the first electrode and electrically connected to one another by vias 450. A second signal pad 441 and a second test pad 442 corresponding to second signal pad 441 are disposed on first layer 44 of the second electrode and electrically connected to one another by vias 460.

During normal operation, first and second test pads 432 and 442 are not connected to any power sources, i.e., floating. During a testing operation, first layer 43 and second layer 45, or first layer 43 and third layer 47 of the first electrode are tested by applying a pair of probes to first signal pad 431 and first test pad 432 to determine whether there is an open-circuiting. Likewise, first layer 44 and second layer 46, or first layer 44 and third layer 48 of the second electrode are tested by applying a pair of probes to second signal pad 441 and second test pad 442 to determine whether there is an open-circuiting. Furthermore, during a testing operation, by applying a pair of probes to first signal pad 431 and second test pad 442, or to second signal pad 441 and first test pad 432, it is able to determine whether there is a short-circuiting between the first and second electrodes.

Figure 1A:
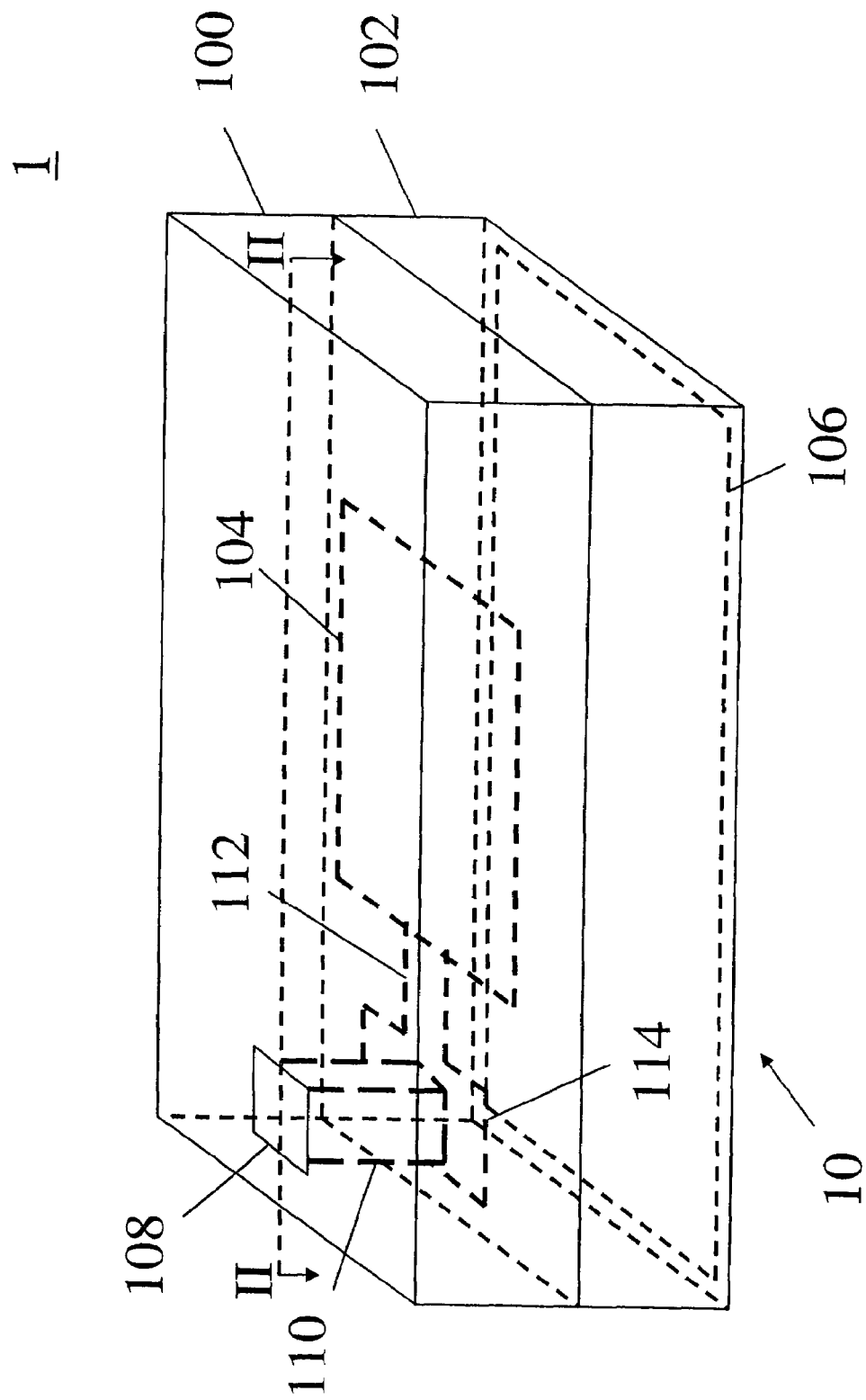
FIG. 1A is a schematic diagram of a conventional multi-layered circuit board provided with a built-in capacitor in a perspective view.
Figure 1B:
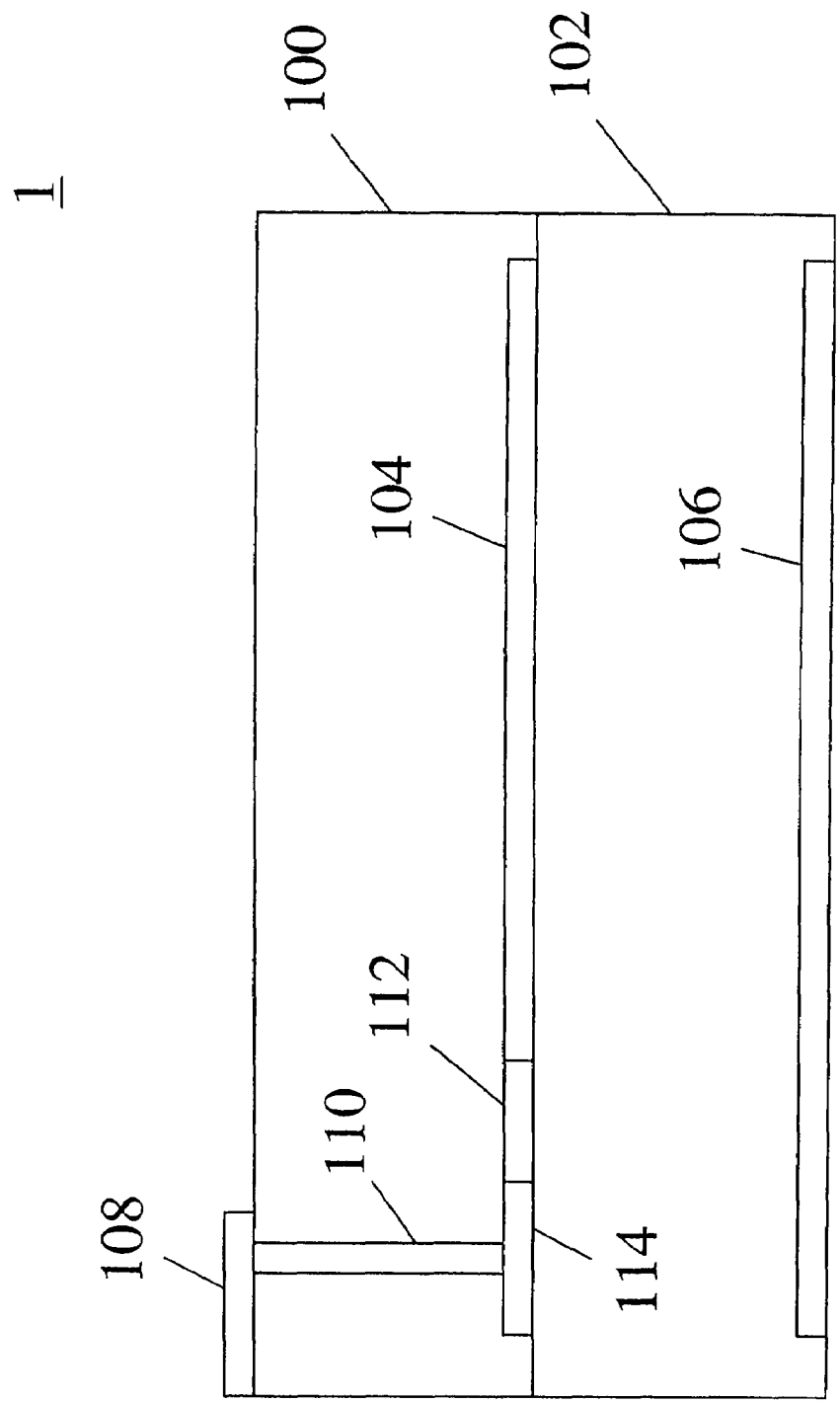
FIG. 1B is a cross-sectional diagram of the multi-layered circuit board shown in FIG. 1A taken along a line II-II.
Figure 5A:
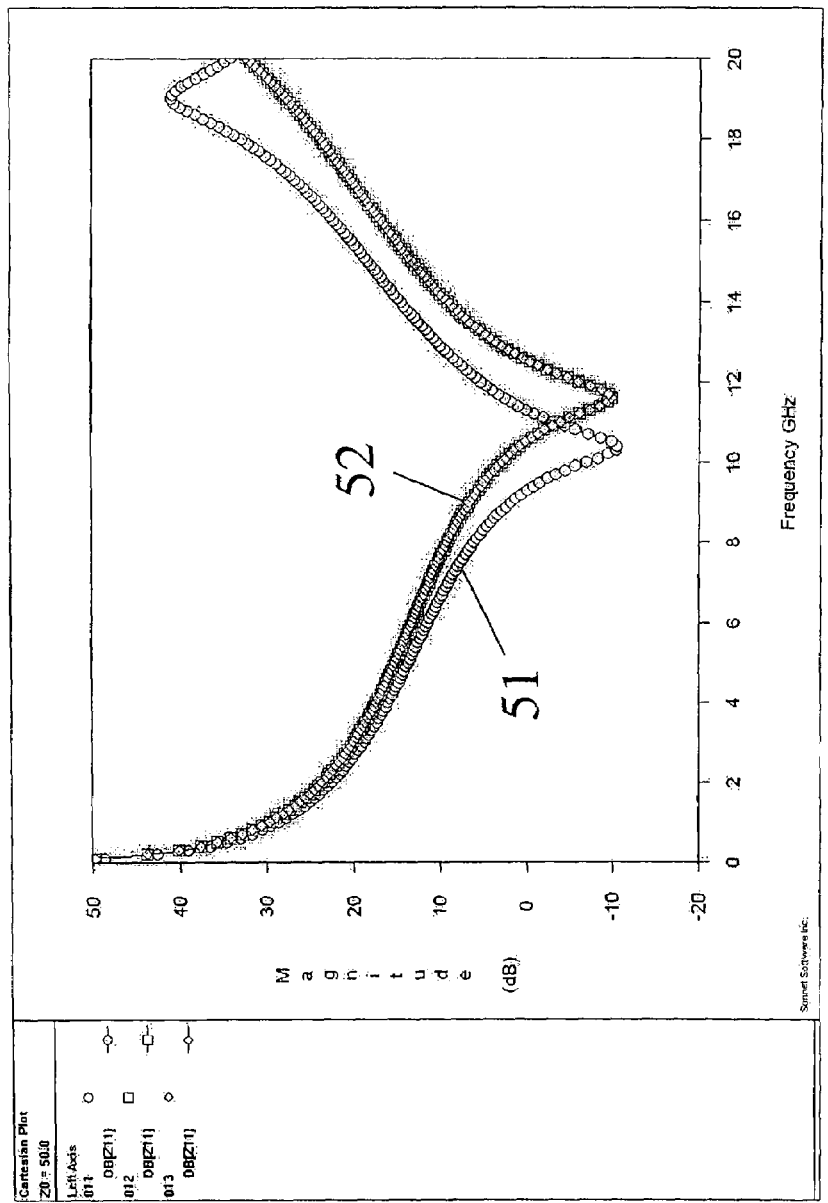
FIG. 5A is a plot illustrating simulation results in impedance-frequency relationship between a multi-layered circuit board having test pads according to the present invention and a conventional multi-layered circuit board without any test pads.

FIG. 5A is a plot illustrating simulation results in impedance-frequency relationship between a multi-layered circuit board having test pads according to the present invention and a conventional multi-layered circuit board without any test pads. Referring to FIG. 5A, a curve 51 represents the result of simulation of a multi-layered circuit board provided with test pads, for example, multi-layered circuit board 2 shown in FIG. 2A or 2B according to the present invention. A curve 52 represents the result of simulation of a multi-layered circuit board without any test pads, for example, multi-layered circuit board 1 shown in FIG. 1A or 1B. In either of multi-layered circuit board 1 or 2, as an example, first electrode plate 104 or 204 has an area of 20×20 mil$^2$, via 110 or 210 has a diameter of 5 mil, and signal pad 108 or 208 has a diameter of 10 mil. Curve 51 has a self-resonance point at approximately 15.6 GHz, while curve 52 has a self-resonance point at approximately 16.6 GHz. By comparison, the self-resonance frequency of capacitor 20 of multi-layered circuit board 2 is smaller than that of capacitor 10 of multi-layered circuit board 1 by approximately 1 GHz. Such a 1-GHz decrease, due to an increase in parasitical inductance as test pads and corresponding vias are added.

Figure 5B:
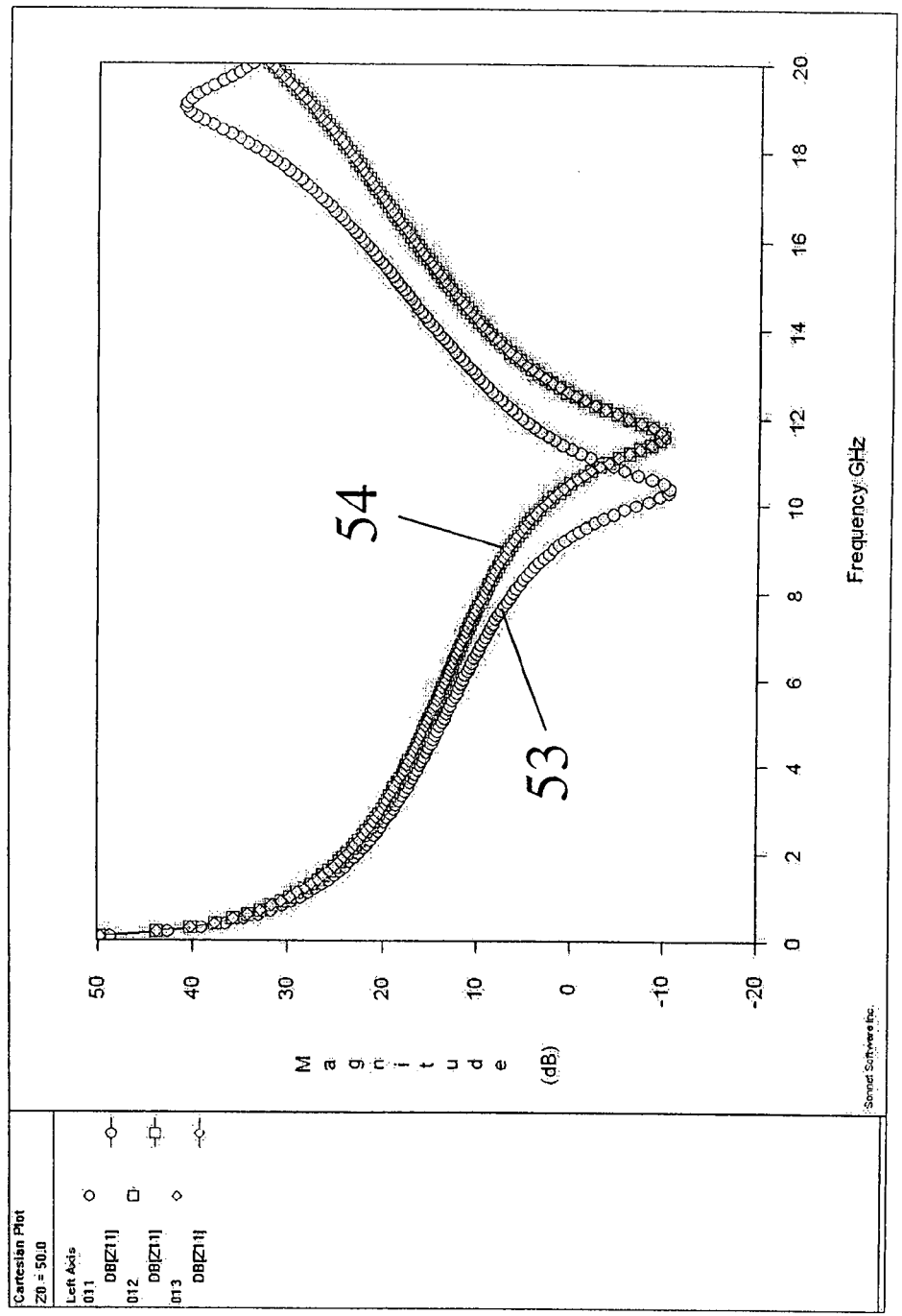
FIG. 5B is a plot illustrating simulation results in impedance-frequency relationship between multi-layered circuit boards having test pads disposed in different distances from respective signal pads.

FIG. 5B is a plot illustrating simulation results in impedance-frequency relationship between multi-layered circuit boards having test pads disposed in different distances from respective signal pads. Referring to FIG. 5B, a curve 53 represents the result of simulation of a multi-layered circuit board having a longer distance between signal pads and test pads, while a curve 54 represents the result of simulation of a multi-layered circuit board having a shorter distance between signal pads and test pads. Curve 53 has a greater self-resonance frequency than curve 54. The shorter the distance between signal pads and test pads, the greater the self-resonance frequency. In one embodiment according to the present invention, the center-to-center distance between a signal pad and a test pad ranges from one to one and a half folds of the signal pad or test pad diameter.

Figure 6:
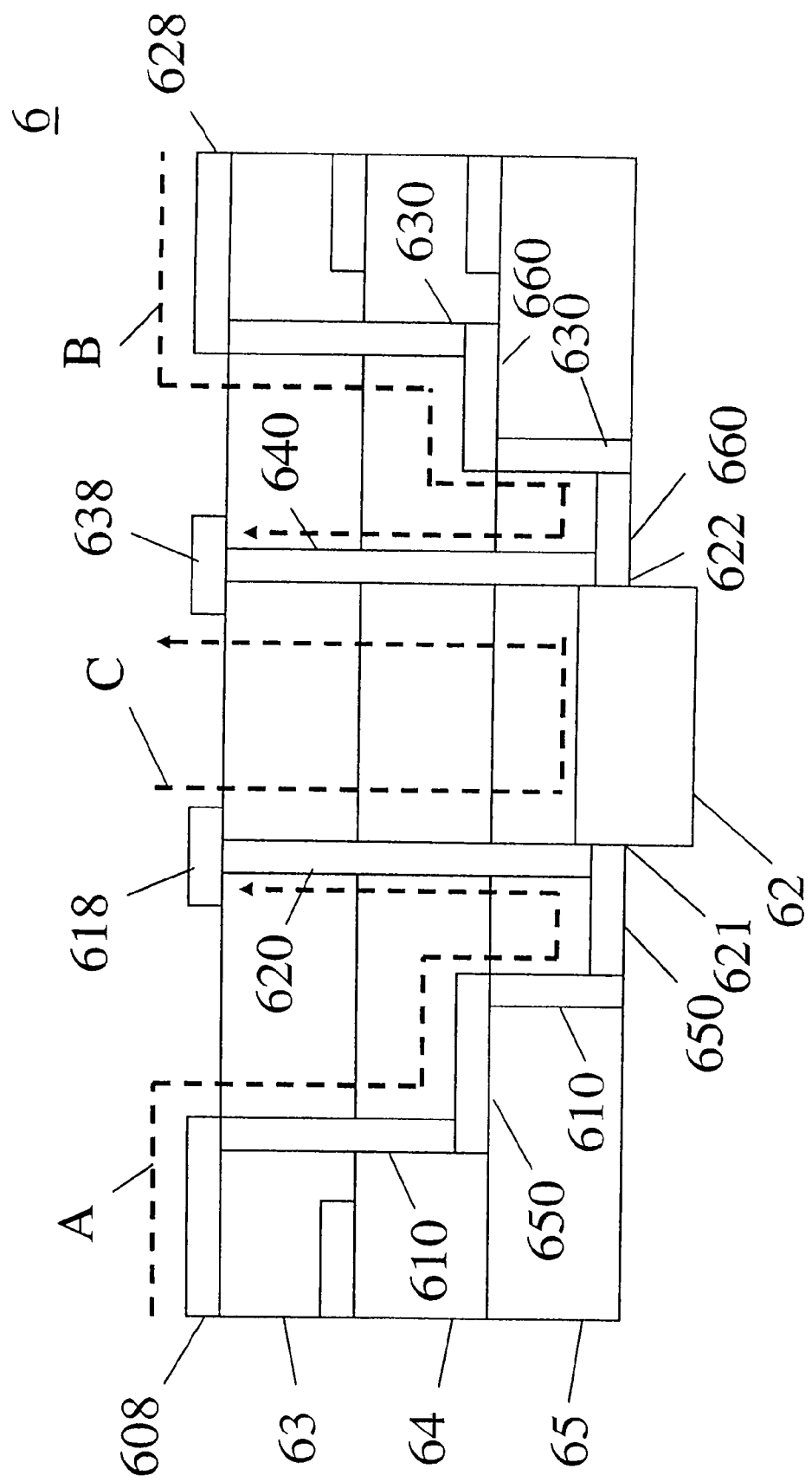
FIG. 6 is a schematic cross-sectional diagram of a multi-layered circuit board provided with a built-in component in accordance with yet another embodiment of the present invention in a cross-sectional view.

FIG. 6 is a schematic cross-sectional diagram of a multi-layered circuit board 6 provided with a built-in component 62 in accordance with yet another embodiment of the present invention in a cross-sectional view. In the present example, built-in component 62 includes one of an inductor or resistor. Examples of a built-in inductor will be discussed later by reference to FIGS. 7A and 7B. As to a built-in resistor, since skilled persons in the art will understand that a conductive line or trace in a layer of a multi-layered circuit board may function to serve as a resistor, illustration of a built-in resistor is not necessary. Referring to FIG. 6, multi-layered circuit board 6 includes dielectric layers 63, 64 and 65, and a built-in inductor 62. A first signal pad 608 and a first test pad 618 corresponding to first signal pad 608 are provided on a top surface (not numbered) of multi-layered circuit board 6. First signal pad 608 is electrically connected to first test pad 618 through vias 610 and 620, traces 650 and a first terminal 621 of inductor 62. A second signal pad 628 and a second test pad 638 corresponding to second signal pad 628 are provided on the top surface of multi-layered circuit board 6. Second signal pad 628 is electrically connected to second test pad 638 through vias 630 and 640, traces 660 and a second terminal 622 of inductor 62.

During normal operation, first and second test pads 618 and 638 are kept at a floating state. During a testing operation, first signal pad 608 and first test pad 618 are probed to determine whether a path denoted as A is open-circuited. Second signal pad 628 and second test pad 638 may be probed to determine whether a path B is open-circuited. Furthermore, first test pad 618 and second test pad 638 are probed to determine whether a path C extending through inductor 62 is open-circuited. In other embodiments of the present invention, first signal pad 608 and second signal pad 628 are probed to determine whether a path (not numbered) extending through inductor 62 is open-circuited. First signal pad 608 and second test pad 638, or second signal pad 628 and first test pad 618 are probed to determine whether there is an open-circuiting in respective paths (not numbered).

Figure 7A:
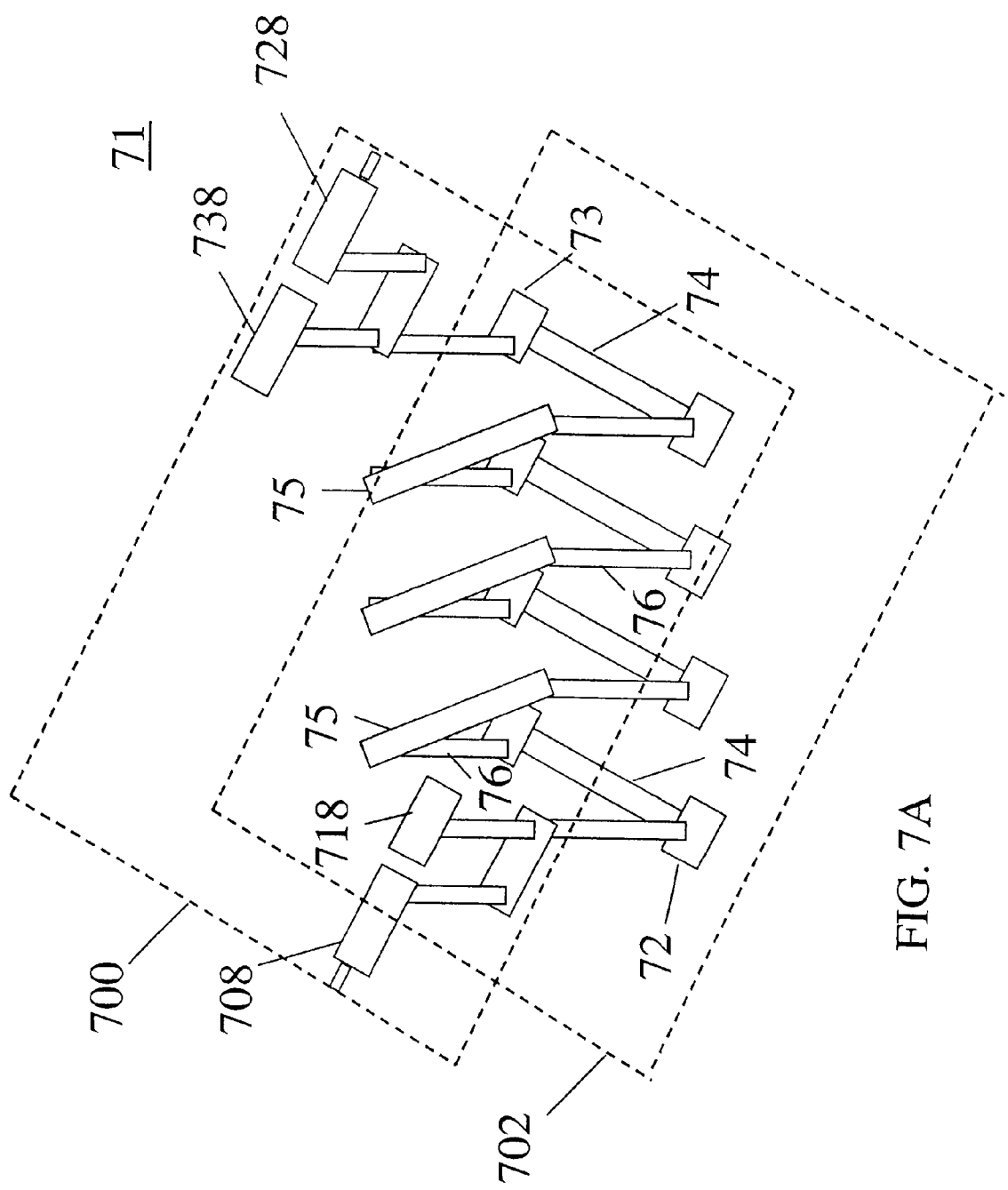
FIG. 7A is a diagram of a built-in inductor in accordance with one embodiment of the present invention in a perspective view.

FIG. 7A is a diagram of a built-in inductor 71 in accordance with one embodiment of the present invention in a perspective view. Referring to FIG. 7A, built-in inductor 71 includes a first terminal 72, a second terminal 73, and a plurality of conductive lines or traces 74 and 75 extending from first terminal 72 to second terminal 73 through vias 76. Traces 74 are disposed in a layer 702 of a multi-layered circuit board (not numbered), and traces 75 are disposed in another layer (not shown) of the multi-layered circuit board. A first signal pad 708 in electrical connection with first terminal 72 and a first test pad 718 corresponding to first signal pad 708 are disposed in still another layer 700 of the multi-layered circuit board. Furthermore, a second signal pad 728 in electrical connection with second terminal 73 and a second test pad 738 corresponding to second signal pad 728 are disposed in layer 700. The testing operation for inductor 71 has been previously discussed by reference to FIG. 6.

Figure 7B:
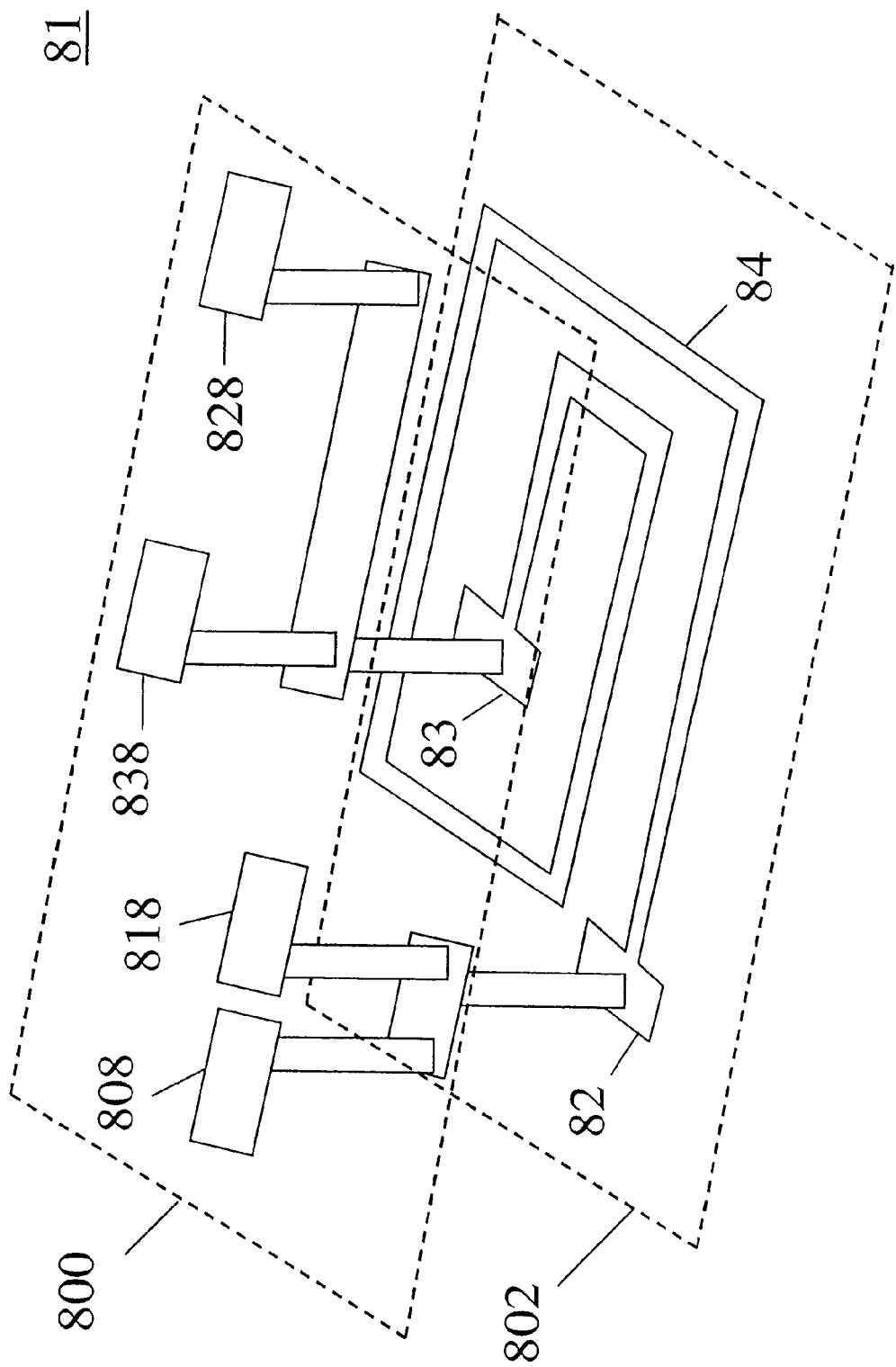
FIG. 7B is a diagram of a built-in inductor in accordance with another embodiment of the present invention in a perspective view.

FIG. 7B is a diagram of a built-in inductor 81 in accordance with another embodiment of the present invention in a perspective view. Referring to FIG. 7B, built-in inductor 81, which is a solenoid-type inductor, includes a first terminal 82, a second terminal 83, and a winding conductive line or trace 84 extending from first terminal 82 to second terminal 83. First terminal 82, second terminal 83 and trace 84 are disposed in a layer 802 of a multi-layered circuit board (not numbered). A first signal pad 808 in electrical connection with first terminal 82 and a first test pad 818 corresponding to first signal pad 808 are disposed in another layer 800 of the multi-layered circuit board. Furthermore, a second signal pad 828 in electrical connection with second terminal 83 and a second test pad 838 corresponding to second signal pad 828 are disposed in layer 800. The testing operation for inductor 81 has been previously discussed by reference to FIG. 6.

Figure 8:
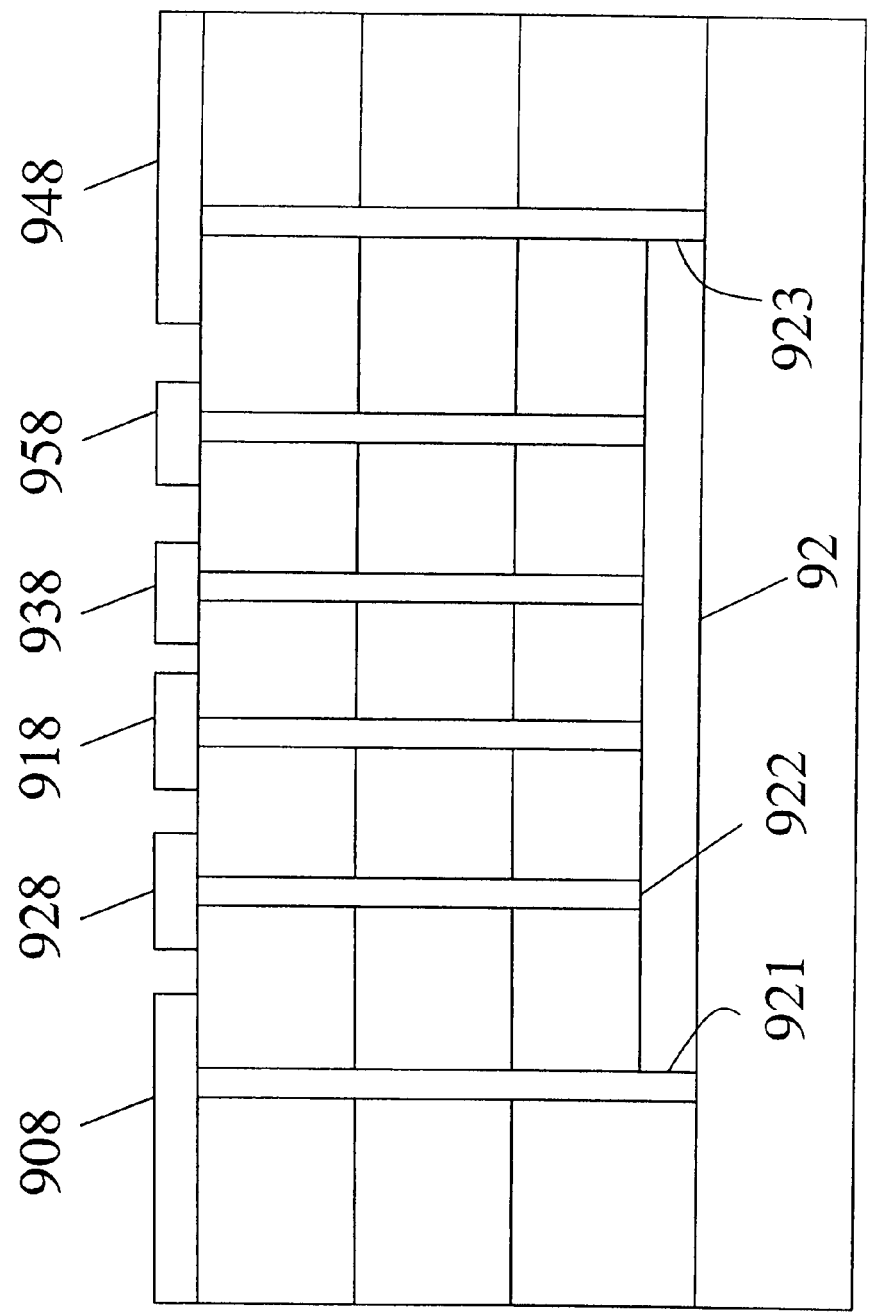
FIG. 8 is a cross-sectional diagram of a multi-layered circuit board including a built-in multi-port element in accordance with one embodiment of the present invention.

Embodiments of a passive component such as a capacitor, an inductor or a resistor built in a multi-layered circuit board have been illustrated. Skilled persons in the art, however, will understand that the present invention may be applied to an active component or a multi-terminal component in addition to the two-terminal components previously discussed. In one embodiment according to the present invention, the multi-terminal component includes one of a multi-port microwave passive element or a transistor. FIG. 8 is a cross-sectional diagram of a multi-layered circuit board 9 including a built-in multi-port element 92 in accordance with one embodiment of the present invention. Referring to FIG. 8, built-in multi-port element 92, for example, a filter or a balun, includes a first port 921, a second port 922 and a third port 923. First, second and third ports 921, 922 and 923 are respectively electrically connected through vias (not numbered) to a first signal pad 908, a second signal pad 928 and a third signal pad 948 formed on a top surface of multi-layered circuit board 9. A first test pad 918 corresponding to first signal pad 908 is formed on the top surface for testing whether a first electrical path extending from first signal pad 908 through first port 921 to first test pad 918 is open-circuited. Likewise, a second test pad 938 corresponding to second signal pad 928 is formed on the top surface for testing whether a second electrical path extending from second signal pad 928 through second port 922 to second test pad 938 is open-circuited. Furthermore, a third test pad 958 corresponding to third signal pad 948 is formed on the top surface for testing whether a third electrical path extending from third signal pad 948 through third port 923 to third test pad 958 is open-circuited.

As an example of a transistor, which generally includes a gate terminal, a source terminal and a drain terminal, at least a test pad corresponding to one of the gate, source or drain terminal may be formed on a top surface of a multi-layered circuit board for testing an electric path extending from a signal pad formed on the top surface through the corresponding one terminal to the test pad.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for testing a built-in component including multiple terminals in a multi-layered circuit board, comprising:

providing a signal pad on a top surface of the multi-layered circuit board;

electrically connecting the signal pad to a first terminal of the multiple terminals of the built-in component at a first location;

providing a test pad on the top surface of the multi-layered circuit board;

electrically connecting the test pad to the first terminal of the built-in component at a second location;

applying a first probe to the signal pad and a second probe to the test pad; and determining a connection status of an electric path extending from the signal pad to the test pad, the electric path extending through the first terminal of the multiple terminals to which the signal pad and test pad is electrically connected, by applying a signal to the first probe and detecting the presence or absence of the signal at the second probe, detection of the presence or absence of the signal being indicative of the connection status.

2. The method of claim 1, wherein the built-in component includes one of a capacitor, an inductor, a resistor, a multi-port passive element or a transistor.

3. The method of claim 1, wherein the first terminal to which the signal pad is connected is within the multi-layer circuit board and below the top layer.

4. A method for testing a built-in capacitor including a first electrode and a second electrode in a multi-layered circuit board, comprising:

providing a first signal pad on a top surface of the multi-layered circuit board;

electrically connecting the first signal pad to the first electrode of the built-in capacitor;

providing a first test pad on the top surface of the multi-layered circuit board;

electrically connecting the first test pad to the first electrode of the built-in capacitor;

applying a first probe to the first signal pad and a second probe to the first test pad; and determining whether there is an open-circuiting in an electric path extending from the first signal pad to the first test pad, the electric path extending through the first electrode, by applying a signal to the first probe and detecting the presence or absence of the signal at the second probe, detection of the presence or absence of the signal being indicative of whether there is an open-circuiting.

5. The method of claim 4, further comprising:

providing a second signal pad on the top surface of the multi-layered circuit board;

electrically connecting the second signal pad to the second electrode;

providing a second test pad on the top surface of the multi-layered circuit board; and electrically connecting the second test pad to the second electrode.

6. The method of claim 5, further comprising:

determining whether there is an open-circuiting in an electric path extending from the second signal pad to the second test pad, by applying a second signal to the second signal pad and detecting the presence or absence of the second signal at the second test pad.

7. The method of claim 5, further comprising:

determining whether there is a short-circuiting between the first signal pad and the second test pad, by applying a third signal to the first signal pad and detecting the presence or absence of the third signal at the second test pad.

8. The method of claim 5, further comprising:

determining whether there is a short-circuiting between the second signal pad and the first test pad, by applying a fourth signal to the second signal pad and detecting the presence or absence of the fourth signal at the first test pad.

9. The method of claim 5, further comprising:

determining whether there is a short-circuiting between the first signal pad and the second signal pad, by applying a fifth signal to the first signal pad and detecting the presence or absence of the fifth signal at the second signal pad.

10. The method of claim 5, further comprising:

determining whether there is a short-circuiting between the first test pad and the second test pad, by applying a sixth signal to the first test pad and detecting the presence or absence of the sixth signal at the second test pad.

11. The method of claim 4, wherein the first electrode to which the first signal pad is connected is within the multi-layer circuit board and below the top layer.

* * * * *